United States Patent [19]

McLaughlin et al.

[11] Patent Number: 5,616,888
[45] Date of Patent: Apr. 1, 1997

[54] RIGID-FLEX CIRCUIT BOARD HAVING A WINDOW FOR AN INSULATED MOUNTING AREA

[75] Inventors: Steven R. McLaughlin, Muskego; Christopher J. Wieloch, Brookfield, both of Wis.; John C. Mather, Cedar Rapids, Iowa

[73] Assignee: Allen-Bradley Company, Inc., Milwaukee, Wis.

[21] Appl. No.: 537,216

[22] Filed: Sep. 29, 1995

[51] Int. Cl.$^6$ ..................................... H05K 1/02
[52] U.S. Cl. ................ 174/260; 174/254; 174/252; 174/255; 361/764; 361/749; 361/761
[58] Field of Search .................................. 174/252, 254, 174/262, 260, 255, 261; 361/749, 761, 764, 792, 795; 439/67, 77

[56] References Cited

U.S. PATENT DOCUMENTS

| | | | |
|---|---|---|---|
| 3,760,090 | 9/1973 | Fowler | 174/52 S |
| 4,539,622 | 9/1985 | Akasaki | 361/401 |
| 4,630,172 | 12/1986 | Stenerson et al. | 361/386 |
| 4,861,272 | 8/1989 | Clark | 439/79 |
| 5,041,899 | 8/1991 | Oku et al. | 354/74 |
| 5,045,642 | 9/1991 | Ohta et al. | 174/266 |
| 5,306,874 | 4/1994 | Biron | 174/272 |

*Primary Examiner*—Laura Thomas
*Attorney, Agent, or Firm*—Joseph N. Ziebert; John M. Miller; John J. Horn

[57] ABSTRACT

A rigid-flex multilayer circuit board or laminated circuit board includes an insulated mounting area for a surface mount package. The mounting area is provided in a recess or portion of the circuit board where the circuit board is only a single flexible circuit board layer thick. The insulated mounting area is provided in a blind via in the multilayer circuit board. The insulating medium associated with the single flexible circuit board layer is less than 2.0 mils thick and includes polyimide. The single flexible circuit board layer provides a heat conductive yet highly electrically insulative mounting area for receiving a heat sink. The heat sink can be mounted on a side opposite the electrical device. The heat sink may be a standard heat sink or a copper coil directly soldered to the circuit board. The heat sink mounting area eliminates the need for bolts, nuts, brackets, and an additional insulating layer necessary to insulate power semiconductor components.

29 Claims, 6 Drawing Sheets

RIGID-FLEX CIRCUIT BOARD HAVING A WINDOW FOR AN INSULATED MOUNTING AREA

CROSS-REFERENCE TO RELATED APPLICATIONS

The present application is related to U.S. Ser. No. 08/292,491, filed Aug. 18, 1994, by Wieloch, and assigned to the assignee of the present invention, and U.S. patent application entitled "Wireless Circuit Board system for a Motor Controller," filed on an even date herewith by Wieloch et al.

FIELD OF THE INVENTION

The present invention relates to a multilayer circuit board including a mounting area configured to facilitate heat dissipation from an electrical device. More particularly, the present invention relates to a rigid-flex circuit board configured to maximize heat dissipation from a power electrical component.

BACKGROUND OF THE INVENTION

In general, multilayer circuit boards are utilized in high power applications such as motor controllers, computers, power supplies, or other control devices. Typically, these boards include high-power electrical devices such as resistors and semiconductors to perform the functions required by the associated applications. As a result, these electrical devices often generate a significant amount of heat, and require heat sinks or other thermal management systems to prevent the circuit boards and electrical devices from overheating.

Heat sinks are typically metal components relatively large in size and secured to circuit boards or associated electrical devices to enhance heat dissipation therefrom. In particular, heat sinks are attached to a thermally and electrically conductive portion of an electrical device. For example, heat sinks are frequently secured directly to the lead frame of the device with hardware such as brackets, bolts, or other mountings. This additional hardware is expensive and increases the assembly time for the circuit board. The heat sinks are often electrically isolated from the lead frame with a heat conducting, electrically insulating layer of film or other material which is placed between the electrical device and the heat sink. Such a layer is disadvantageous because installing the layer increases the assembly time for the circuit board. In addition, depending on the material and its thickness, this insulating layer can create an undesirable thermal resistance layer. Furthermore, the integrity of the layer is very difficult to inspect.

Some electrical devices are packaged as surface mount devices which utilize a minimum amount of space on the circuit board. However, higher power surface mount devices must be mounted on or near large pads or sections of a metal layer on the circuit board to provide adequate heat dissipation. These large sections are disadvantageous because the space required by the large sections could otherwise be utilized by other electrical components. To reduce the size of these large sections, surface mount devices are often mounted on circuit boards made from ceramic, epoxy/alumina covered metal base plates, or other materials which have a high thermal conductivity. Drawbacks with ceramic circuit boards include their expense, brittleness and weight.

Thus, there is a need for a multilayer circuit board having an insulated mounting area for a surface mount device and a heat sink. There is also a need for a low cost insulated mounting for a heat sink which requires a small amount of board space and is thermally conductive.

SUMMARY OF THE INVENTION

The present invention relates to a multilayer circuit board including a first circuit board layer and a second circuit board layer. The first circuit board layer has an insulating polyimide layer disposed between a top surface and a bottom surface. The top surface of the first circuit board layer has a pad for an electrical or heat dissipating device. The second circuit board layer is adhered to the first circuit board layer and is configured so that the pad is exposed.

The present invention also relates to a method of manufacturing a laminated circuit board. The method comprises the steps of placing a footprint (i.e. electrical device mounting area) at a locus on a top surface of a flexible circuit board layer, configuring a rigid board layer to provide a window through this rigid board layer, and attaching the flexible board layer and the rigid board layer together, whereby the window corresponds to the locus of the footprint.

The present invention further relates to a multilayer circuit board including a plurality of rigid circuit board layers and at least one flexible board layer. The multilayer circuit board is improved by providing a mounting area for an electrical device located on the top surface of the multilayer circuit board. The rigid circuit board layers are configured to have only the at least one flexible board layer between the top surface and the bottom surface at the mounting area.

The present invention further relates to a circuit board upon which a semiconductor device and heat sink are mounted. The circuit board includes a mounting flexible layer and at least one rigid circuit board layer. The mounting flexible layer has a pad configured for the semiconductor device on a first side and a heat sink area for the heat sink on a second side. The at least one rigid circuit board layer has an aperture over the heat sink area and the pad.

The present invention also relates to a rigid-flex motor controller circuit board system being manufactured from at least one flexible circuit board layer and at least one rigid circuit board layer. The motor controller circuit board system includes a power substrate circuit board module for receiving semiconductor switches on the flexible circuit board layer, a capacitive circuit board module for storing capacitors, and another circuit board module having external connectors. The capacitive circuit board module is electrically and mechanically coupled to the power substrate circuit board module via the flexible circuit board layer, and the other circuit board module is electrically and mechanically coupled to either the power substrate board module or the capacitive board module via the flexible circuit board layer.

The present invention advantageously allows an electrical device and a heat sink to be mounted on a multilayer circuit board without the use of bolts, brackets, or other hardware. In one aspect of the present invention, the multilayer circuit board has an insulated mounting for a surface mount device and a heat sink on a portion of the circuit board which has only a single layer of flexible circuit board. The flexible circuit board is less than 0.002 inches thick and is made from polyimide material. The mounting utilizes the inherent electrical isolation provided by the high dielectric content of the flexible circuit board, the high heat conductivity of the flexible circuit board, and the extremely thin nature of the flexible circuit board layer to provide superior heat transmission and electrical isolation.

In another aspect of the present invention, the heat sink can be soldered directly to the single layer on an opposing side from the electrical device, thereby providing a superior heat transmission media at a very low cost and using only a minimal amount of board space. The present invention advantageously does not require the use of an additional insulating material between the heat sink and the electrical device.

In a further aspect of the present invention, the flexible circuit board includes enhanced copper layers for superior heat dissipation. The flexible circuit board layer preferably includes two 2.0 ounce copper layers (e.g., 0.0028 inch thick metal layers). The copper layers are covered with an adhesive polyimide layer and an over coat polyimide layer. The polyimide layers can be doped with AlN, diamond particles, $Al_2O_3$, BeO or other Al based materials to increase thermal conductivity. A bond ply, film layer or adhesive polyimide formed over the polyimide overcoat can be an insulating layer to which another copper layer could be adhered.

BRIEF DESCRIPTION OF THE DRAWINGS

Preferred embodiments of the invention will hereinafter be described in conjunction with the appended drawings, where like numerals denote like elements and.

DETAILED DESCRIPTION OF PREFERRED EXEMPLARY EMBODIMENTS

Figure 1:
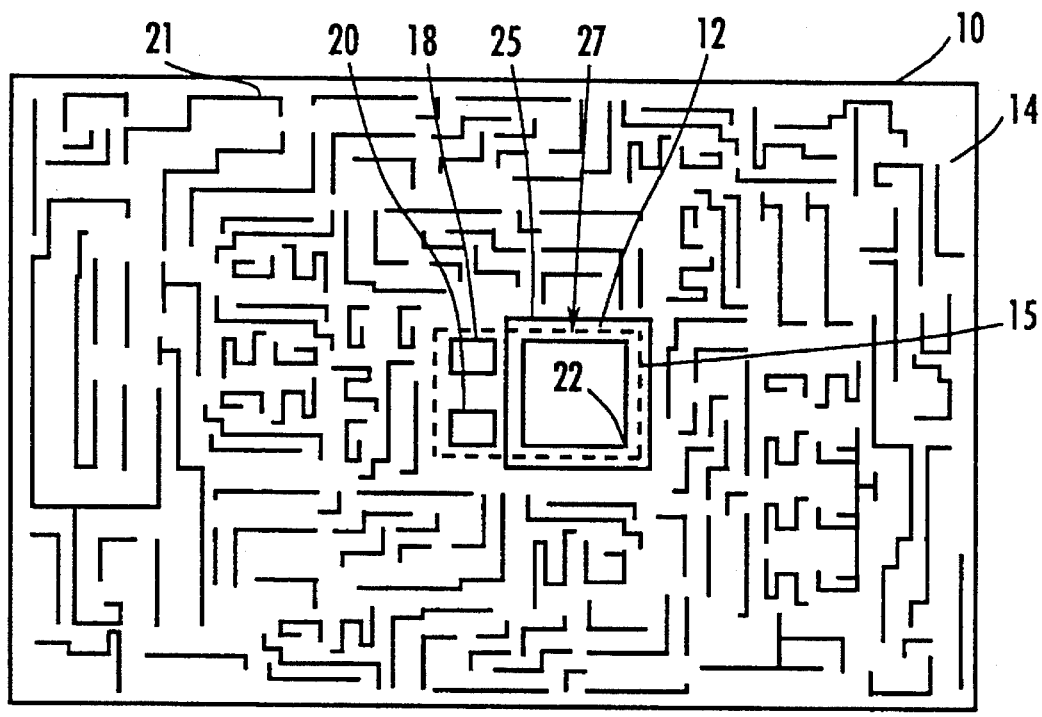
FIG. 1 is a top view of a rigid-flex circuit board according to a first embodiment of the present invention.

FIG. 1 shows a rigid-flex multilayer circuit board 10 in accordance with the present invention. Multilayer circuit board 10 is comprised of a mounting layer 12 and at least one additional layer 14. Layer 12 is a thin flexible circuit board layer such as a single or double sided Kapton® layer, polyimide layer or other flexible layer including an insulating medium coupled to a conducting plane (not shown in FIG. 1). Layer 14 is a rigid circuit board layer such as laminated epoxy glass (e.g., FR-4) coupled to a conducting plane (not shown in FIG. 1).

Board 10 includes a footprint 15 for an electrical device (not shown in FIG. 1) which may be soldered or attached to board 10. Footprint 15 includes a pad 18, a pad 20 and a pad or contact area 22. Contact area 22 is preferably located on top of mounting layer 12. Pads 18 and 20 are preferably mounted on top of layer 14. Alternatively, board 10 may be configured such that pads 18 and 20 are mounted on layer 12, or on any additional layer between layers 12 and 14.

A blind via or recess 27 is provided in multilayer circuit board 10 by fabricating (e.g., machining, molding, etching) an aperture 25 in layer 14 to expose contact area 22. In the manufacture of circuit boards, channels which are fabricated into, but not completely through, a multilayer circuit board are commonly referred to as "blind vias." Aperture 25 may be fabricated before or after layer 14 is secured (e.g., adhered) to layer 12.

Figure 2:
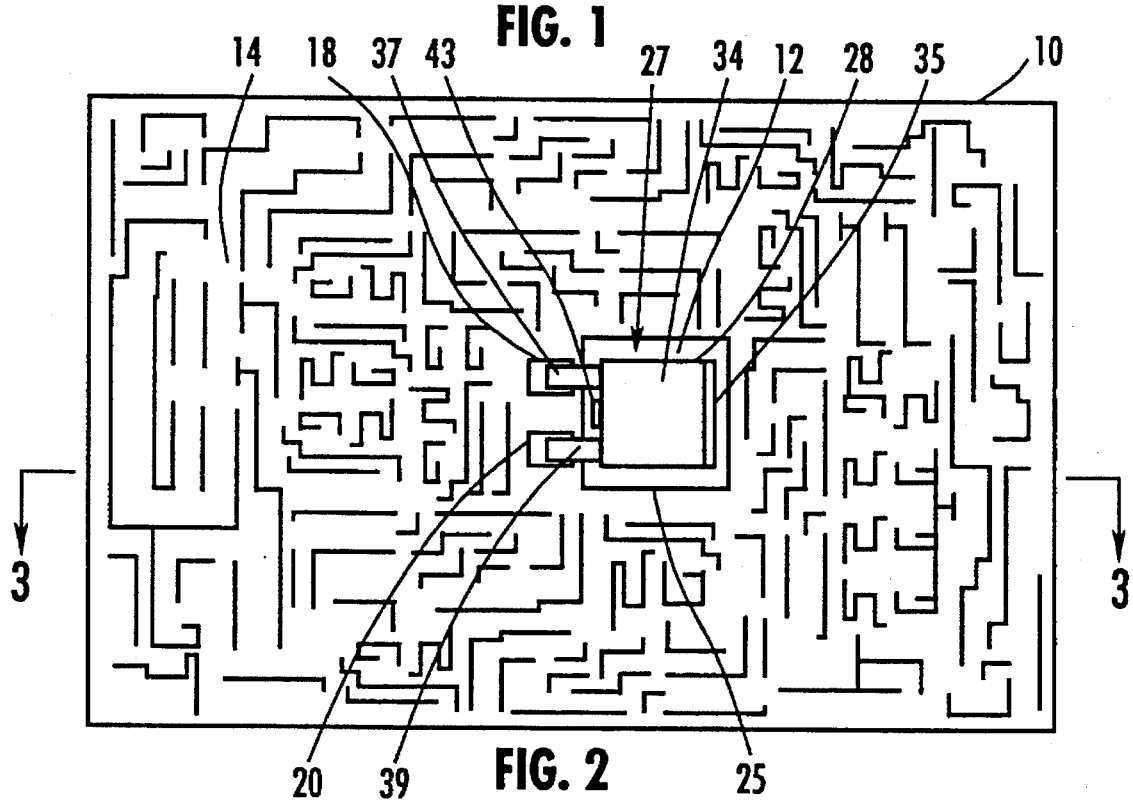
FIG. 2 is a top view of the rigid-flex circuit board illustrated in FIG. 1 including a surface mount semiconductor device.
Figure 3:
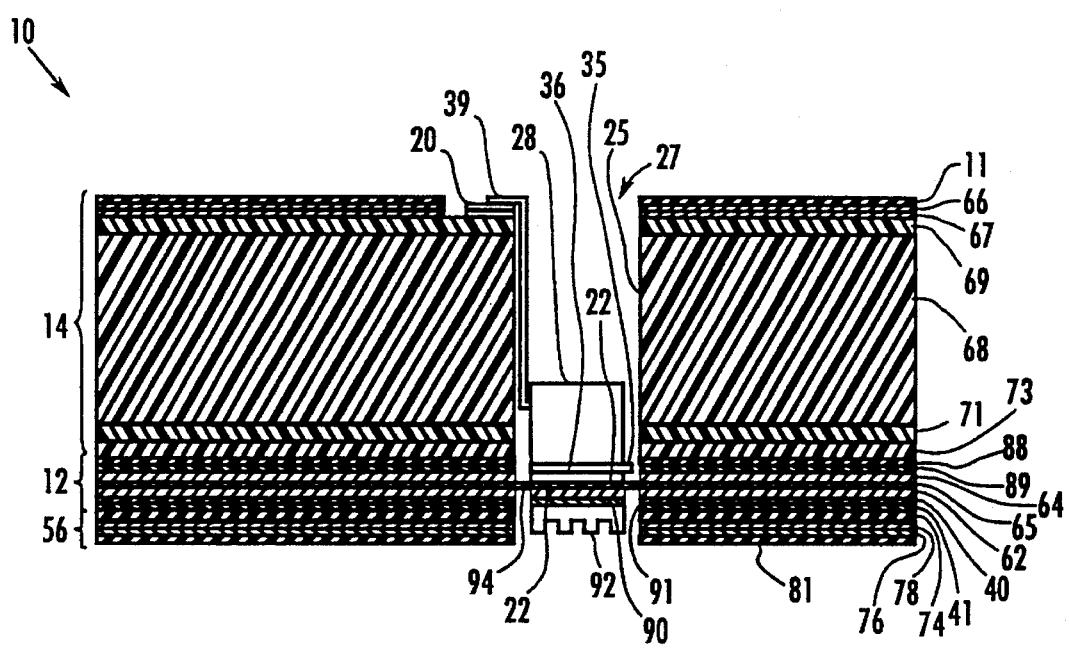
FIG. 3 is a cross sectional view of the rigid-flex circuit board illustrated in FIG. 2 along line 3—3 in FIG. 2.

With reference to FIGS. 2 and 3, circuit board 10 includes a surface mount electrical device 28 mounted on contact area 22 of board 10 within recess 27. Electrical device 28 is preferably a power semiconductor device such as a voltage regulator, power transistor, diode, op-amp, IGBT, thyristor, SCR, or triac. Electrical device 28 may also be a resistor, or other power component requiring relatively high heat dissipation. Device 28 is preferably packaged in a surface mount package such as a D pack, D2 pack, D3 pack, ICE pack, or other high density board mounting package.

Device 28 is housed in a plastic package or other casing 34 and includes a lead frame 35 and leads 37, 39, and 43. Leads 37 and 39 are preferably soldered to pads 18 and 20, respectively. Lead 43 is preferably internally electrically coupled to lead frame 35. An underside 36 (FIG. 3) of lead frame 35 preferably provides a mounting surface which can be advantageously mechanically and/or electrically connected (e.g., reflow soldered, wave soldered) to contact area 22.

With reference to FIG. 3, board 10 is comprised of layer 12, layer 14, and a layer 56. Layer 14 is preferably a single or double sided printed circuit board layer including a rigid 0.030 inch thick insulating layer 68 disposed between 0.0027 inch thick glass fiber bond ply (e.g., 1080 GF) layers 69 and 71. Layer 68 can be a fiber reinforced material such as GFN. A 0.0027 inch thick glass fiber bond film layer 73 is attached to layer 71. A thin conductive or metal layer 67 is attached to layer 69. Layer 67 is preferably a 0.0014 inch thick layer of THE copper. Layer 67 is plated with a 0.001 inch thick layer 66 of copper. Layer 66 is coated with a 0.002 inch thick layer 11 of solder mask.

Layer 12 is preferably a flexible circuit board layer manufactured by Parlex Corporation of Methuen, Mass. Layer 12 includes a 0.0007–0.001 inch thick polyimide layer 88, a 0.001–0.002 inch thick polyimide adhesive layer 89, a 2.0ounce (0.0028 inch thick) copper layer 64, a 0.00125 inch thick polyimide Kapton/MT® adhesive polyimide layer 65, a 2.0-ounce (0.0024 inch thick) copper layer 62, a 0.001–0.002 inch thick polyimide adhesive layer 40, and a 0.0007–0.001 inch thick polyimide layer 41. Layers 40, 41, 62, 64, 65, 88 and 89 are attached as shown in FIG. 3. Layer 65 is comprised of a 0.00075 inch layer (not shown) of polyimide between two 0.00025 inch layers of adhesive polyimide (not shown). Layers 40, 41, 88 and 89 can be doped with diamond material, AlN, $Al_2O_3$ or other substances to increase thermal conductivity and provide enhanced electrical corona resistance. Preferably, layer 65 is doped with 36% of $Al_2O_3$. On each side of the middle 0.00075 inch polyimide layer within layer 65, the 0.00025 inch of adhesive polyimide is preferably doped with a material to enhance corona resistance (per IEC 343 test spec).

Layer 56 is attached to layer 12. Layer 56 includes an insulating layer 74 of 0.0018–0.0027 inch thick glass fiber bond ply material (e.g., 1080 IF or 106) attached to thin conductive or metal layer 78. Layer 78 is a 0.0014 inch thick layer of THE copper which is plated with a 0.001 inch copper layer 76. Metal layers 62, 64, 66, 67, 76, and 78 can be copper, silver, conductive inks, aluminum or other conductive materials which are etched or deposited to provide conductors such as printed circuit board conductors 21 (FIG. 1).

Insulating layers 68, 69, 71, 73 and 74 can be glass reinforced epoxy, GR4, FR4, FR5, paper mica, Teflon® flural polymer, or other insulating materials. Insulating layers 68, 69, 71, 73 and 74 prevent conductors such as printed circuit board conductors 21 from shorting with printed circuit board conductors of other layers. Metal layer 64 on the top of layer 12 is etched or deposited to provide contact area 22. Metal layer 62 on the bottom of layer 12 is etched or deposited to provide a heat sink area 90. Metal in areas 94 surrounding area 90 is etched out to electrically isolate heat sink area 90 from the remainder of metal layer 65.

Heat sink area 90 preferably allows a heat conductive component such as a heat sink 92 to be soldered directly to layer 12. Heat sink 92 is preferably a copper, aluminum, or other heat conductive material designed for dissipating heat. Heat sink 92 can also be a lightweight copper coil assembly such as radiator-type heat sink elements or electrical industry standard heat sink such as those manufactured by Thermalloy, Inc. or E&G Wakefield Engineering. Heat sink area 90 advantageously allows thin copper coils such as radiator heat sinks, which ordinarily cannot be utilized with standard heat sink mountings, to be attached to board 10 as heat sink 92. Heat sink 92 may also be reflow soldered, wave soldered, thermally conductive metal or non-metal filled epoxy adhered, or otherwise attached to board 10. Solder provides a highly heat conductive medium for attaching heat sink 92 to heat sink area 90.

Recess 27 allows heat generated by electrical device 28 to be advantageously transmitted through very thin layer 65 to heat sink 92. Preferably, insulating layer 65 of layer 12 is a polyimide material approximately 0.00125 inches thick. Additionally, metal layers 62 and 64 preferably have an enhanced thickness, (at least 2.0 ounce copper) to augment the heat dissipation from device 28. The dimensions of layer 12 and high thermal conductivity of the polyimide material allow heat to be efficiently transmitted from device 28 to heat sink 92. The mounting of device 28 in recess 27 results in temperature drop across layer 65 of approximately 5° C. when approximately 10 watts is conducted through a mounting pad sized approximately 0.65"×0.65".

The mounting of device 28 in recess 27 also advantageously provides a mounting with a dielectric strength which can withstand over 4,500 volts from device 28 to heat sink 92 with excellent long term corona breakdown resistance capability. The configuration of recess 27 allows heat sink 92 and electrical device 28 to be mounted on board 10 using a minimal amount of assembly time and board space.

Heat sink 92 and heat sink area 90 may be smaller or larger than footprint 15. The configuration of the mounting having heat sink area 90 on the opposite side of layer 12 from footprint 15 allows an economic use of board space. For example, the relatively bulky heat sink 92 may be mounted on a bottom side of board 10 away from other components such as device 28 mounted on the top side of board 10.

Alternatively, board 10 may be configured to have a single layer mounting area on the top layer of board 10 by providing the recess through the bottom layers of board 10.

Also, board 10 may be configured to have the mounting area on an intermediate layer (not shown) between layers 12 and 14 by providing the recess through the top layers and bottom layers of board 10.

In a further embodiment, aperture 25 may be eliminated by providing a mounting area close to one end of board 10. Layers 14 and 56 can be sized smaller than layer 12 and shifted to one end so that the single layer mounting area is provided on the opposite end of layer 12. Also, layers 14 and 56 can be comprised of unitary pieces which may be configured on top of layer 12 to form recess 27. In yet another alternative, layer 12 may be replaced by multiple flexible layers.

With reference to FIGS. 1–3, the manufacture of rigid-flex multilayer board 10 is discussed below. Layer 12 is formed from rolled, annealed copper material to form layers 64 and 62 which are attached to flexible layer 65. Layer 12 is available commercially from various manufacturers, including Arlon, Nelco, Sheldahl, Rogers, or DuPont. Layers 62 and 64 are etched to form a conductive pattern (not shown) including footprint 15 or contact area 22 and heat sink area 90. Adhesive layer 89 is attached to a polyimide cover coat or layer 88, and adhesive layer 40 is attached to a polyimide cover coat or layer 41. A steel ruled die or other device is utilized to remove layers 40, 41, 88 and 89 from the locus of footprint 15 and heat sink area 90. After layers 40, 41, 88 and 89 are configured to expose contact area 22 and heat sink area 90, layers 40, 41, 88 and 89 are adhered to layers 62 and 64. Exposed copper such as on layer 12 at area 20 and at heat sink area 90 is then coated with solder or other etch resistent material.

Layer 14 without layers 11, 66, 67 and 69 attached (e.g., layers 68 and 71) is routed, cut, pressed, molded, or otherwise configured to form aperture 25 for recess 27. Alternatively, layer 69 can be included with layer 14 in the above operation. Additionally, layer 74 of layer 56 is routed, cut, pressed, molded or otherwise configured to form an aperture 91 for heat sink area 90. Next, layer 67 is attached to layer 69, and layer 78 is attached to layer 74. Layer 67 covers contact area 22 (e.g., aperture 25), and layer 78 covers heat sink area 90 (e.g., aperture 91). Layers 12, 14 and 56 are then attached or laminated together (without layers 11, 66, 76 and 81).

After lamination, multilayer board 10 is drilled, and plated. Layers 66 and 76 are added to layers 14 and 56 respectively, in the plating process. After multilayer board 10 is plated, board 10 is etched. Layers 66 and 67 and layers 74 and 76 covering aperture 25 and aperture 29, respectively, are removed during this etching process along with creating the circuit pattern desired in layers 66, 67, 76 and 78 on the remaining area of board 10. Footprint 15 and heat sink area 90 are not affected by this etching process because they have been previously covered in the etch resistant material before layer 12 was joined with layers 14 and 56. The bridging of layer 66 and 67 above aperture 25 and layers 76 and 78 below aperture 91 ensures that the sides of apertures 25 and 91 are not coated with conductive material during the plating process. After etching, a stripping technique is utilized to remove etch resist material from within aperture 25 and aperture 91 (on area 22 and 90), thereby providing a clean footprint 15 or area 22 and heat sink area 90. Next, solder mask layers 11 and 81 are added to layers 66 and 76 respectively, and multilayer board 10 is coated or plated with solder or other appropriate solderable material to form a pattern in accordance with solder mask layers 11 and 81 and on areas 22 and 90 (e.g., in essence any exposed copper traces on board 10).

Figure 4:
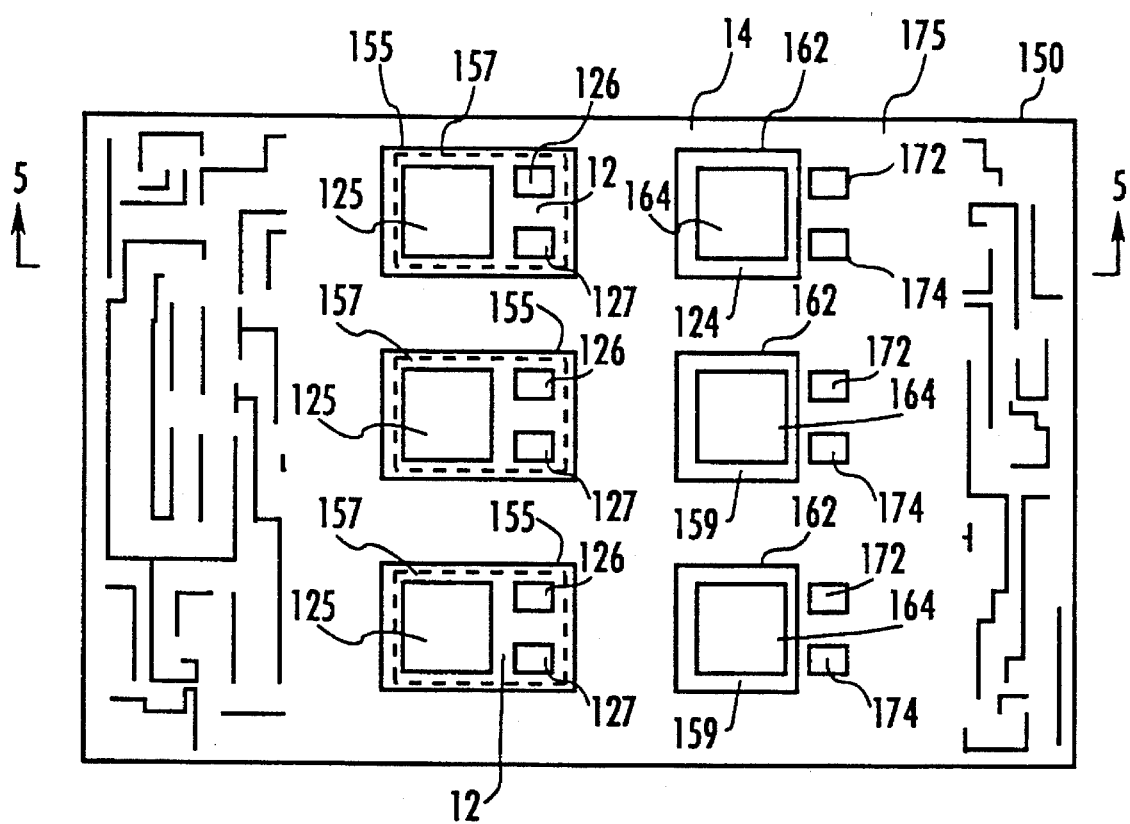
FIG. 4 is a top view of a rigid-flex circuit board according to a second embodiment of the present invention.

FIG. 4 illustrates another embodiment of a laminated or rigid-flex multilayer circuit board 150 substantially similar to board 10 illustrated in FIG. 1 wherein board 150 includes a number of mounting areas for a number of electrical devices (not shown). Board 150 includes blind vias or recesses 155 having entire footprints 157 located within recess 155. Footprint 157 includes pads 126, 127 and a main pad 125. Entire footprints 157 are provided on layer 12. Board 150 also includes recesses 162 similar to recess 27 (FIG. 1) which have only main pads 164 within recess 162. Pads 172 and 174 are provided on a top surface 175 (e.g., layer 14 and, more specifically, layer 66) of board 150.

Figure 5:
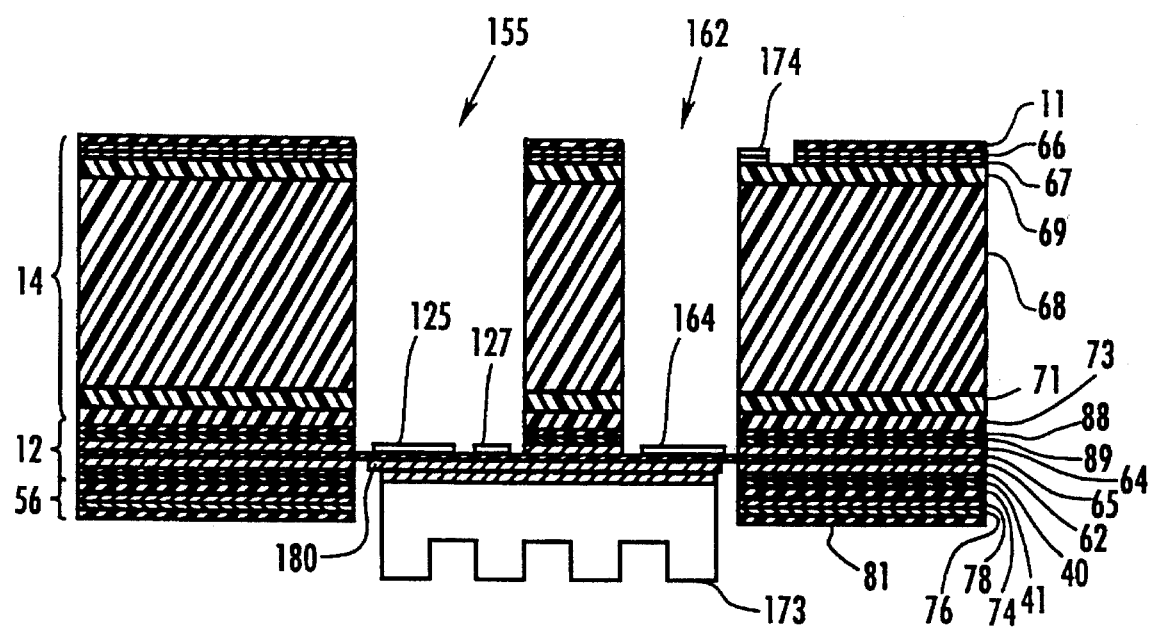
FIG. 5 is a cross sectional view of the rigid-flex circuit board illustrated in FIG. 4 along line 5—5 in FIG. 4.

With reference to FIG. 5, a unitary heat sink area 180 is provided opposite recesses 155 and 162 (FIG. 4). A single heat sink 173 can be attached or soldered to unitary heat sink area 180. Therefore, single heat sink 173 can be advantageously used to enhance heat dissipation for several electrical devices mounted in recesses 155 and 162. Alternatively, heat sink area 180 may be divided into unitary heat sink areas for individual electrical devices. In another alternative, one of recesses 155 may be made large enough to include all of footprints 157 and main pads 164. In yet another alternative, thin strips of rigid circuit board material in layer 14 can remain across the single recess (not shown) to provide mechanical strength for mounting heat sinks 92 or 173 and devices 28.

Figure 6:
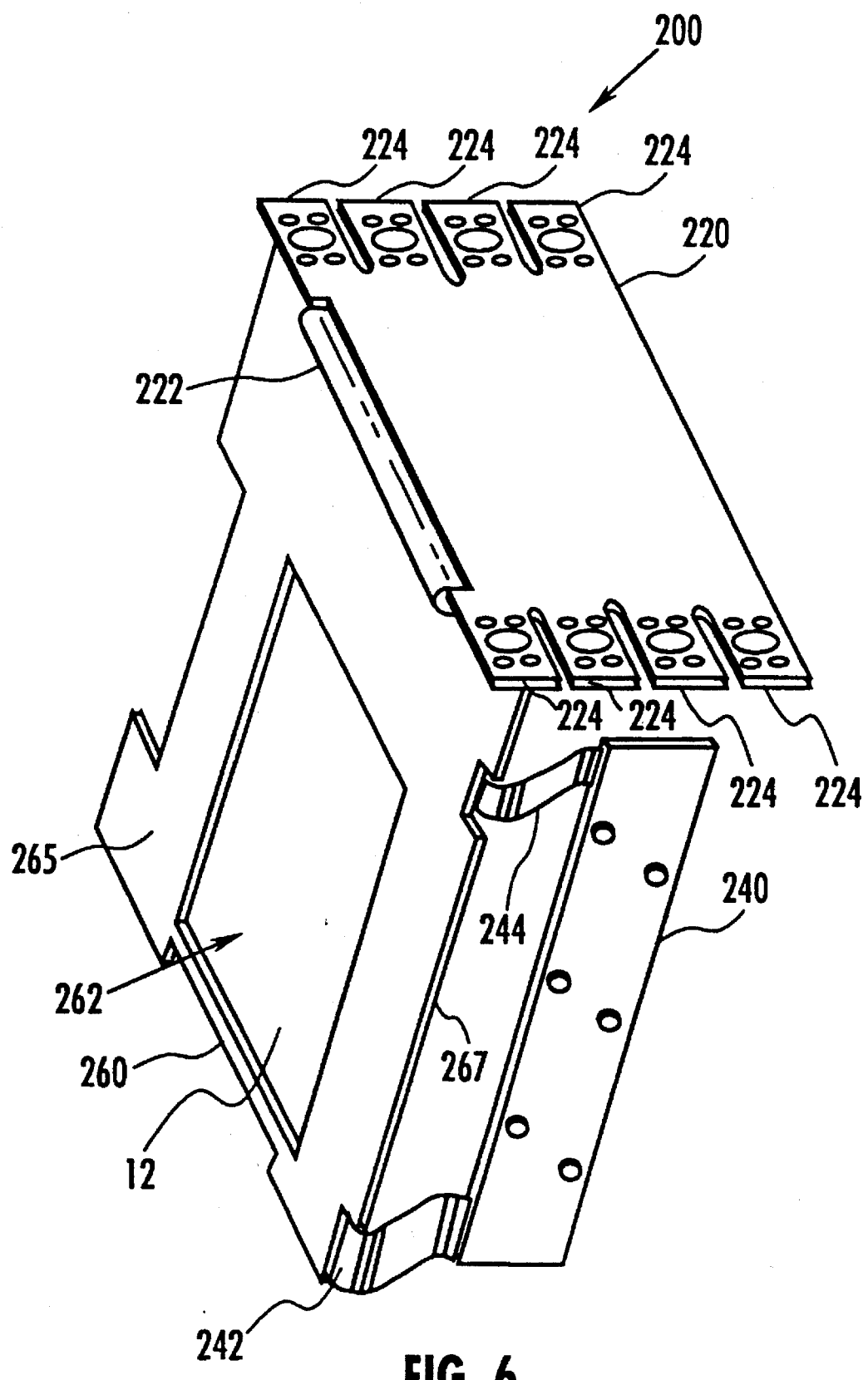
FIG. 6 is a perspective view of a multilayer rigid-flex circuit board system in a perpendicular configuration for a motor controller according to a third embodiment of the present invention.
Figure 7:
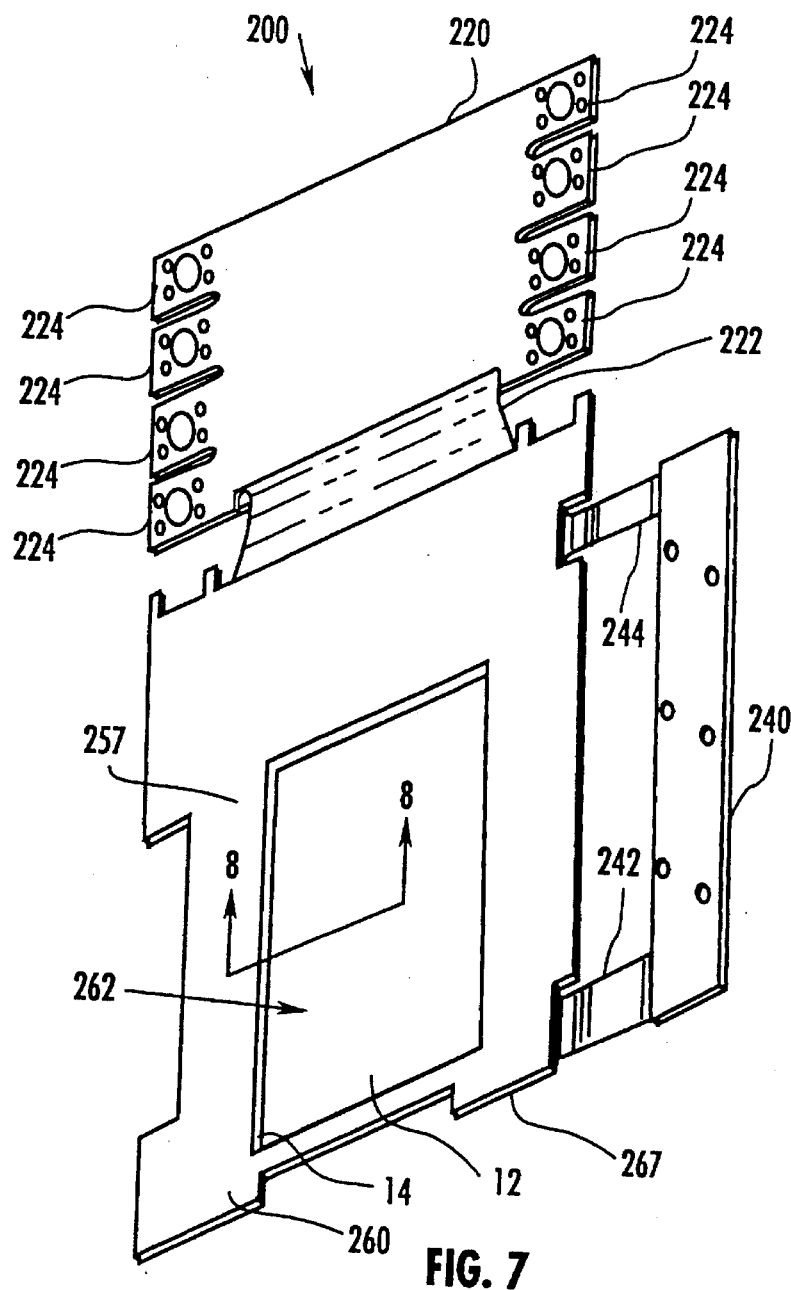
FIG. 7 is a perspective view of the rigid-flex multilayer circuit board system, illustrated in FIG. 6, in a flat configuration.
Figure 8:
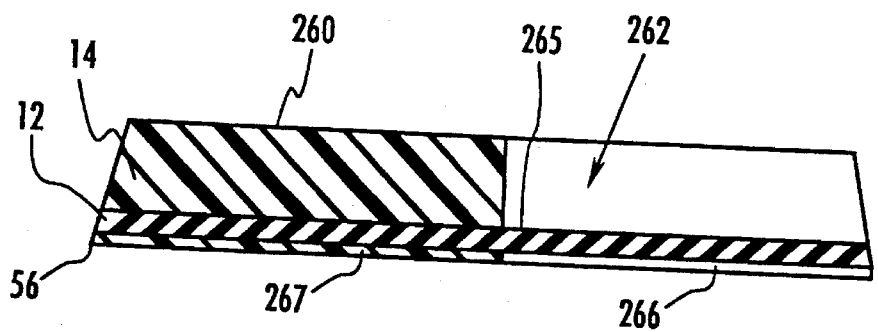
FIG. 8 is a cross sectional view of the rigid-flex multilayer circuit board system illustrated in FIG. 7 along line 8—8.

With reference to FIG. 6, the advantageous rigid-flex multilayer circuit board structure as discussed with reference to circuit boards 10 and 150 is shown implemented in a motor controller circuit board system 200. Motor controller circuit board system 200 includes a module or customer interface board 220 having connector tabs 224, a module or power substrate 260, and a module or a capacitor board 240. Power substrate 260 preferably houses IGBT's, SCR's, bipolar transistors, diodes, or other semiconductor switches (not shown) which provide alternating current (AC) power signals for use by a motor (not shown). Preferably, power substrate 260 includes a window 262 (or several alternate size windows) which has only a flexible circuit board layer 12 at a locus between a top surface 265 and a bottom surface 267 (FIG. 8). Preferably, a heat sink (not shown) is mounted on a heat sink area 266 (FIG. 8) of surface 267 and devices, such as device 28, (see FIGS. 1–5) are attached to surface 265 in window 262.

System 200 is preferably manufactured from a single flexible circuit layer 12, a rigid circuit board layer 14, and a rigid circuit board layer 56 (FIG. 8). Layer 12 is preferably continuous with customer interface board 220, power substrate 260, and capacitor circuit board 240. Flexible layer 12 provides power bus connectors 242 and 244 between power substrate 260 and capacitor board 240. Connectors 242 and 244 preferably house a positive and negative power bus conducting line on each side of connectors 242 and 244 (e.g., layer 12). Additionally, layer 12 provides a connection 222 from substrate 260 to motherboard 220.

Customer interface board 220 and capacitor circuit board 240 are preferably disposed at a 90° angle with respect to substrate 260 as shown in FIG. 6. A heat sink (not shown) is preferably attached to surface 267 (e.g., on the same side of substrate 260 from which board 220 and capacitor board 240 extend). This advantageous orientation of system 200 provides superior heat dissipation in a compact package. Alternatively, the sides of board 10 or module 260 on which heat sinks 92 or 173 and devices 28 are attached can be switched.

The configuration of circuit board system 200 allows high power connections to be made between customer interface board 220, board 240 and substrate 260 without the use of bulky, unreliable and expensive connectors for interconnecting board 220, board 240, and substrate 260. Further, the flexibility associated with flexible layer 12 allows customer interface board 220, board 240 and substrate 260 to be manipulated for various mechanical packages and eases manufacture of circuit board system 200. The use of connections between board 220, board 240 and substrate 260 via flexible layer 12 reduces the use of external wires and connectors and hence, the parasitic inductance associated with the interconnection of circuit boards. Therefore, circuit board system 200 provides an advantageous compact structure for a motor controller which is not prone to parasitic inductance problems. Additionally, this use of layer 12 for connections dramatically reduces creepage and clearance distance concerns due to the high voltages present. Furthermore, layer 12 connections provide for impedance control and ground planes in logic signal interconnect areas of system 200.

With reference to FIG. 8, an enlarged cross sectional view of a portion of system shows layers 12, 14 and 56 discussed in greater detail with reference to FIGS. 1–3. Preferably, the thin flexible layer 12 allows superior heat transfer from surface 265 to surface 267 of substrate 260. Board 260 preferably includes heat sink area 266 on bottom surface 267 of layer 12. Alternatively, window 262 or area 266 can be configured to have rigid strips (not shown) of layer 14 or layer 56 provided in a matrix across window 262 or area 266. The rigid strips provides superior mechanical strength for system 200 at window 262 or area 266.

It is understood that, while the detailed drawings, specific examples, and particular materials given describe a preferred exemplary embodiment of the present invention, they are for the purpose of illustration only. The method or apparatus of the invention is not limited to the precise details and conditions disclosed. For example, although particular surface mount packages and electrical devices are described, the circuit board may be populated with other types of heat producing components. Also, various configurations for a heat sink conducting area or circuit board layers can be utilized. Various changes may be made to the details disclosed without departing from the spirit of the invention which is defined by the following claims.

What is claimed is:

1. A multilayer circuit board, comprising:
    a first circuit board layer having an insulating polyimide layer disposed between a first top surface and a first bottom surface, the first top surface having a pad for an electrical or heat dissipating device, the insulating polymide layer being flexible; and
    a second circuit board layer having a second top surface and a second bottom surface, the second bottom surface being attached to first top surface, the second circuit board layer being configured so that the pad is exposed.

2. The multilayer circuit board of claim 1, further comprising a third circuit board layer having a third top surface attached to the first bottom surface, the third circuit board layer being configured so that a heat sink area on the first bottom surface opposite the pad is exposed.

3. The multilayer circuit board of claim 2, further comprising a fourth circuit board layer having a fourth bottom surface attached to the second top surface, the fourth circuit board layer being configured so that the pad is exposed.

4. The multilayer circuit board of claim 3 wherein the second circuit board layer, the third circuit board layer, and the fourth circuit board layer are each comprised of a rigid insulating medium located between two conductor layers.

5. The multilayer circuit board of claim 4 wherein the polyimide layer is doped with $Al_4O_3$.

6. A method of manufacturing a multilayer circuit board, comprising the steps of:

forming a contact area at a locus on a top surface of a flexible board layer;

configuring a first rigid board layer to provide a window through the first rigid board layer; and attaching the rigid board layer and the flexible board layer together, whereby a position of the window corresponds to the locus of the contact area.

7. The method of claim 6 wherein the configuring step is performed by routing the window in the first rigid board layer after the flexible layer is attached to the first rigid board layer.

8. The method of claim 6 wherein the configuring step is performed by routing the window in the first rigid board layer before the flexible board layer is attached to the first rigid board layer.

9. The method of claim 6 further comprising the step of placing a heat sink area opposite the contact area on a bottom surface of the flexible board layer.

10. The method of claim 9 wherein the contact area is a surface mount footprint for a semiconductor device.

11. The method of claim 10 further comprising the steps of:

attaching a power semiconductor to the footprint (by soldering); and attaching a heat sink to the heat sink area (by soldering).

12. The method of claim 6 wherein the configuring step includes forming the window in an insulative layer;

covering the window with a conductive layer; and etching the conductive layer at the window after the attaching step.

13. The method of claim 12 further comprising steps of covering the contact area with an etch resist material before the etching step; and removing the etch resist material after the etching step.

14. A multilayer circuit board including at least one rigid circuit board layer and at least one flexible circuit board layer, the multilayer circuit board having a top side and a bottom side, the improvement comprising a mounting area for an electrical device located on the top side of the multilayer circuit board, wherein the multilayer circuit board has only the at least one flexible circuit board between the top side and the bottom side at the mounting area.

15. The multilayer circuit board of claim 14 wherein the mounting area is within a blind via.

16. The multilayer circuit board of claim 14 wherein the improvement further comprises a heat sink area disposed opposite the mounting area on the bottom side of the multilayer circuit board.

17. A laminated circuit board upon which a semiconductor device, the laminated circuit board comprising:

a mounting flexible layer having a pad configured to support the semiconductor device on a first side; and at least one rigid circuit board layer coupled to the mounting flexible layer, the at least one rigid layer having an aperture over the pad.

18. The laminated board of claim 17 wherein the mounting flexible layer is polyimide and is less than 2.0 mils thick.

19. The laminated board of claim 18 wherein the first side has a plurality of pads configured for a plurality of semiconductor devices and a second side of the mounting flexible layer has a single heat sink area opposite the plurality of pads.

20. The laminated board of claim 17 wherein the mounting flexible layer and at least one additional rigid layer are laminated together.

21. A rigid-flex motor controller circuit board system being manufactured from at least one flexible circuit board layer and at least one rigid circuit board layer, the motor controller circuit board system comprising:

a power substrate circuit board module for receiving semiconductor switches on the flexible circuit board layer;

a capacitive circuit board module for storing capacitors, the capacitive circuit board module being electrically and mechanically coupled to the power substrate circuit board module via the flexible circuit board module layer; and a customer interface board module having external connectors, the customer interface board module being electrically and mechanically coupled to either the power substrate board circuit module or the capacitive circuit board module via the flexible circuit board layer.

22. The rigid-flex motor controller circuit board system of claim 21 wherein the power substrate circuit board includes a window area having only the flexible circuit board layer between a top side and a bottom side of the power substrate circuit board module.

23. The rigid-flex motor controller circuit board system of claim 21 wherein a connection between the capacitor circuit board module and the power substrate circuit board module includes a first type power connector on a top surface of the flexible circuit board layer and a second type power connector on a bottom surface of the flexible circuit board layer.

24. The rigid-flex motor controller circuit board system of claim 23 wherein the connection includes two distinct members of the flexible circuit board layer.

25. The rigid-flex motor controller circuit board system of claim 21 wherein the flexible circuit board layer includes a first enhanced copper layer on the top surface and a second enhanced copper layer on the bottom surface.

26. The rigid-flex motor controller circuit board system of claim 25 wherein the flexible circuit board layer includes polyimide material.

27. The rigid-flex motor controller circuit board system of claim 26 wherein the customer interface board module and capacitor circuit board module are folded at a 90 degree angle with respect to the power substrate circuit board module.

28. The rigid-flex motor controller circuit board system of claim 27 wherein a heat sink is mounted to extend from the power substrate circuit board module in a direction perpendicular to the power substrate circuit board module.

29. The rigid-flex motor controller circuit board system of claim 28 wherein the heat sink, the capacitor circuit board module and the customer interface board module are all located on a same side of the power substrate circuit board module.

* * * * *